(12) United States Patent
Nezuka

(10) Patent No.: US 10,790,851 B2
(45) Date of Patent: Sep. 29, 2020

(54) Δ-Σ MODULATOR, Δ-Σ A/D CONVERTER, AND INCREMENTAL Δ-Σ A/D CONVERTER

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/533,849

(22) Filed: Aug. 7, 2019

(65) Prior Publication Data
US 2019/0363731 A1    Nov. 28, 2019

Related U.S. Application Data

(63) Continuation of application No. PCT/JP2018/003730, filed on Feb. 5, 2018.

(30) Foreign Application Priority Data

Feb. 15, 2017 (JP) ................. 2017-026275

(51) Int. Cl.
  *H03M 3/00*    (2006.01)
(52) U.S. Cl.
  CPC ........... *H03M 3/456* (2013.01); *H03M 3/424* (2013.01)
(58) Field of Classification Search
  CPC ........ H03M 3/456; H03M 3/424; H03M 3/02; H03M 1/52; H03M 1/00; H03M 1/12; H03M 3/50; H03M 7/3004; H03M 3/30
  (Continued)

(56) References Cited

U.S. PATENT DOCUMENTS

| 4,876,543 | A | 10/1989 | van Bavel |
| 7,486,217 | B2 * | 2/2009 | Matsushita ........... H03M 1/005 341/143 |

(Continued)

FOREIGN PATENT DOCUMENTS

| JP | H05-074030 U | 10/1993 |
| JP | H05-074040 U | 10/1993 |

(Continued)

OTHER PUBLICATIONS

Li Ping, "A Combined Successive and Σ-Δ A/D Conversion Scheme", University of Melbourne, Australia, 1993, pp. 1294-1297.

(Continued)

*Primary Examiner* — Jean B Jeanglaude
(74) *Attorney, Agent, or Firm* — Posz Law Group, PLC

(57) ABSTRACT

A ΔΣ modulator includes: an integrator having an operational amplifier and an integral capacitor; a quantizer outputting a quantization result; a D/A converter connected to a first input terminal of the operational amplifier through a first control switch, and subtracting an electric charge based on the quantization result from an electric charge stored in the integral capacitor to perform feedback of the quantization result to the integrator; a control circuit outputting a digital output value; and a sampling capacitor being connected to the first input terminal through a second control switch. The second control switch switches on and off an electrical connection between the sampling capacitor and the intermediate point between the integral capacitor and first input terminal, and plural feedbacks of the quantization results are performed per one sampling cycle.

15 Claims, 11 Drawing Sheets

(58) Field of Classification Search
USPC .................................... 341/143, 155, 171
See application file for complete search history.

(56) References Cited

U.S. PATENT DOCUMENTS

| | | | |
|---|---|---|---|
| 7,619,550 B2* | 11/2009 | Maeda | H03M 3/364 |
| | | | 341/143 |
| 9,281,837 B2* | 3/2016 | Nezuka | H03M 3/368 |
| 9,444,489 B2* | 9/2016 | Roh | H03M 3/39 |
| 2008/0198050 A1* | 8/2008 | Akizuki | H03M 7/3015 |
| | | | 341/136 |
| 2009/0195423 A1 | 8/2009 | Li | |
| 2016/0043733 A1 | 2/2016 | Nezuka | |
| 2016/0149586 A1* | 5/2016 | Roh | H03M 3/39 |
| | | | 341/143 |

FOREIGN PATENT DOCUMENTS

| | | |
|---|---|---|
| JP | 5451317 B2 | 3/2014 |
| JP | 2014-146893 A | 8/2014 |
| JP | 2016-213599 A | 12/2016 |

OTHER PUBLICATIONS

Omid Oliaei, "Analysis of Multipate Sigma-Delta Modulators", Motorola, 2001, pp. I-448-I-451.
Andrea Agnes et al., "High-Resolution Multi-Bit Incremental Converter with 1.5-µV Residual Offset and 94-dB SFDR", University of Pavia, Italy, 2010, pp. 103-106.

\* cited by examiner

US 10,790,851 B2

Δ-Σ MODULATOR, Δ-Σ A/D CONVERTER, AND INCREMENTAL Δ-Σ A/D CONVERTER

CROSS REFERENCE TO RELATED APPLICATION

The present application is a continuation application of International Patent Application No. PCT/JP2018/003730 filed on Feb. 5, 2018, which designated the U.S. and claims the benefit of priority from Japanese Patent Application No. 2017-026275 filed on Feb. 15, 2017. The entire disclosures of all of the above applications are incorporated herein by reference.

TECHNICAL FIELD

The present disclosure relates to a ΔΣ modulator, a ΔΣ A/D converter, and an incremental ΔΣ A/D converter. The ΔΣ modulator may also be referred to as the delta-sigma modulator. The ΔΣ A/D converter may also be referred to as the delta signal analog-to-digital converter. The incremental ΔΣ A/D converter may also be referred to as the delta-sigma analog-to-digital converter.

BACKGROUND

An input signal as a conversion target of an analog-to-digital converter (hereinafter referred to as "A/D converter" or "ADC") is input to the A/D converter through a driver circuit provided in a previous stage of the A/D converter. A ΔΣ A/D converter may be referred to as a highly precise A/D converter. In such a ΔΣ A/D converter, oversampling is used to repeat sampling of the input signal, serving as a conversion target, at high speed. Therefore, a high-speed driver circuit may be required for the ΔΣ A/D converter. In the related art, a ΔΣ modulator in which a quantization result obtained by using a multi-bit quantizer is feedbacked through a 1-bit D/A converter.

SUMMARY

The present disclosure describes a ΔΣ modulator having an integrator, a quantizer and a D/A converter used for A/D conversion, a ΔΣ A/D converter having the ΔΣ modulator, and an incremental ΔΣ A/D converter having the ΔΣ modulator.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
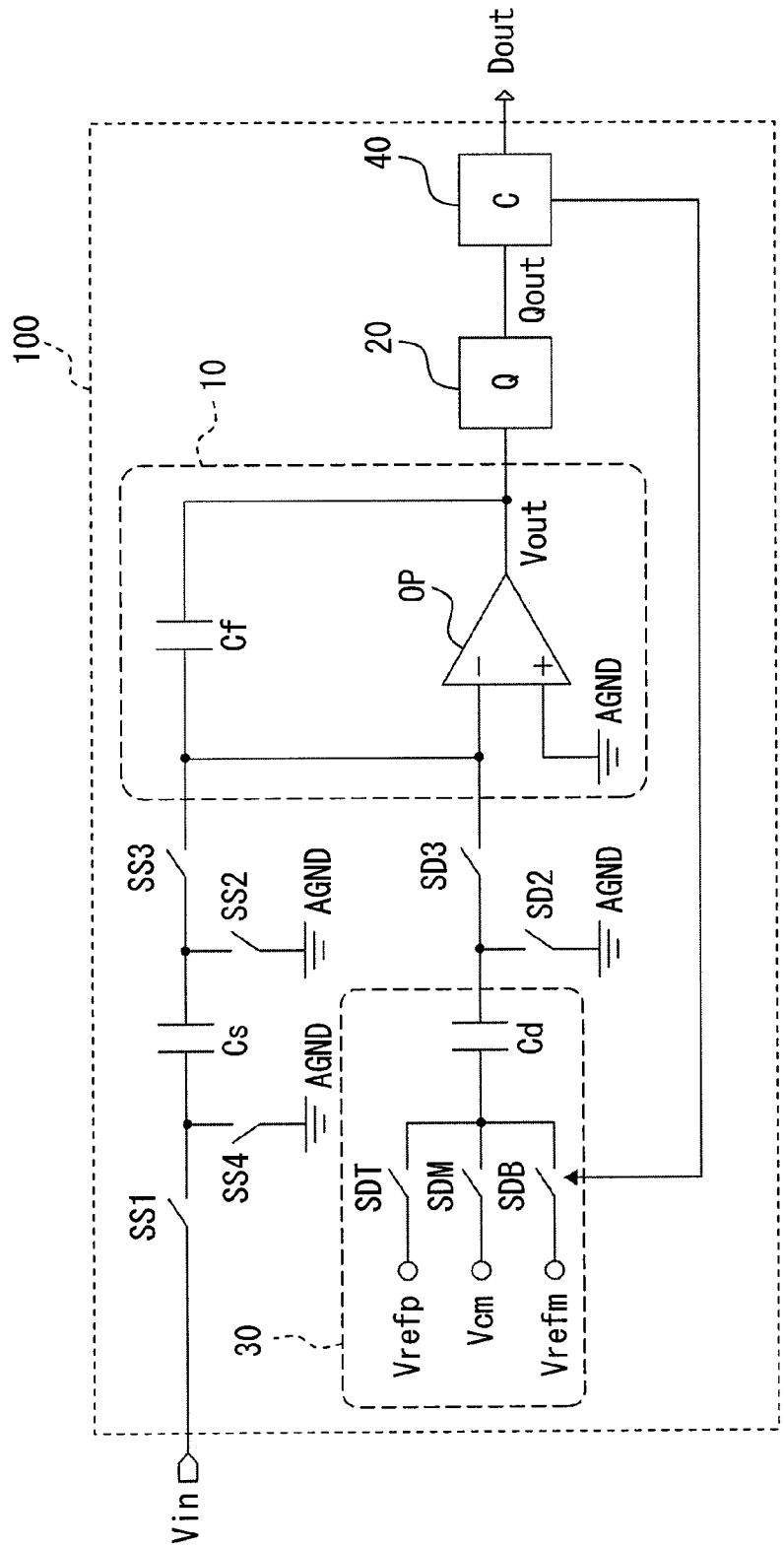
FIG. 1 is a circuit diagram showing a schematic configuration of a ΔΣ modulator in accordance with a first embodiment.

A driver circuit of an A/D converter may be set to have high input impedance, because the input signal, serving as a conversion target, is prevented from being affected by operation of the driver circuit. The driver circuit, which has high input impedance, is generally configured by a single-ended amplifier (includes a pseudo differential amplifier using two single-ended amplifiers). A single-ended amplifier may cause a phase rotation due to the internal circuit configuration thereof, compared with a fully differential amplifier. This makes it difficult for the driver circuit to operate at high-speed, compared with the A/D converter that is often configured by a fully differential amplifier. Accordingly, operating speed of the A/D converter may be restricted by the input signal, serving as a conversion target, to be input to the A/D converter through the driver circuit.

The ΔΣ modulator in a related art is a ΔΣ modulator in which feedback is performed plural times using a 1-bit D/A converter, in response to one-time quantization performed by a multi-bit quantizer. Like a typical ΔΣ modulator, a feedback cycle of the D/A converter and a sampling period of the input signal are the same as each other, i.e., high-speed oversampling are required. Therefore, the driver circuit provided in a previous stage of the ΔΣ modulator may restrict processing speed of ΔΣ modulation.

The present disclosure may provide a ΔΣ modulator for performing high-speed ΔΣ modulation while preventing an increase in sampling frequency of oversampling, a ΔΣ A/D converter using the ΔΣ modulator, and an incremental ΔΣ A/D converter are provided in one or more embodiments of the present disclosure.

The ΔΣ modulator in accordance with one aspect of the present disclosure includes: an integrator having an operational amplifier and an integral capacitor; a quantizer that outputs a quantization result obtained by quantizing an output signal of the operational amplifier; a D/A converter that is connected to the first input terminal of the operational amplifier through a first control switch, and that is configured to subtract an electric charge based on the quantization result from electric charges stored in the integral capacitor to perform feedback of the quantization result to the integrator in ΔΣ modulation and is; and a control circuit that outputs a digital output value based on the quantization result. The D/A converter may also be referred to as DAC. The operational amplifier has a first input terminal and an output terminal. The integral capacitor is inserted between the first input terminal and the output terminal.

The ΔΣ modulator further includes a sampling capacitor in which an electric charge based on an analog signal serving as an input signal are stored. The sampling capacitor is connected to the first input terminal of the operational amplifier through a second control switch. The second control switch is disposed between the sampling capacitor and an intermediate point of the integral capacitor and the first input terminal, and is configured to switch on and off an electrical connection between the sampling capacitor and the intermediate point. Plural feedbacks of the quantization result are performed in the ΔΣ modulation on the analog signal per one sampling cycle including a sampling period during which the second control switch is turned off, and a period during which the second control switch is turned on.

In the general ΔΣ modulator, a feedback cycle of the quantization result and a sampling period of the analog signal are the same as each other. On the other hand, in the present disclosure, by turning off the second control switch, the sampling capacitor may be disconnected from the operational amplifier, the integral capacitor, and the DAC, electrically. Accordingly, the feedback of the quantization result performed by using the DAC, and the sampling of the analog signal performed by using the sampling capacitor may be controlled independently from each other.

Thus, the DAC may set the feedback cycle independently from the sampling period, thereby making it possible to perform the feedback at a period shorter than the sampling period, without being restricted by operating speed of the driver circuit. Therefore, it is possible to improve resolution of the A/D conversion, which is obtained during one sampling, so that high-speed or high-resolution A/D conversion may be performed in the same sampling frequency, compared with the ΔΣ modulator in the related art.

Hereinafter, embodiments of the present disclosure will be described based on the drawings. Between the following drawings, the same numerals are mutually assigned to the same or equivalent components.

First Embodiment

A schematic configuration of a ΔΣ modulator in accordance with the present embodiment will be described with reference to FIG. 1.

A ΔΣ modulator 100 is a ΔΣ modulator that may be used for a ΔΣ A/D converter. An analog signal Vin is input to the ΔΣ modulator 100 through a driver circuit, and then the analog signal Vin is converted into a digital signal Dout.

As shown in FIG. 1, the ΔΣ modulator 100 includes an integrator 10, a quantizer 20 (e.g., Q in FIG. 1), a digital-to-analog converter 30 (hereinafter, referred to as "DAC" or "D/A converter"), a control circuit 40 (e.g., C in FIG. 1), and a sampling capacitor Cs.

The integrator 10 has an operational amplifier OP and an integral capacitor Cf. The integral capacitor Cf is inserted between an inverted input terminal and an output terminal of the operational amplifier OP. In other words, the output terminal of the operational amplifier OP is connected to the inverted input terminal of the operational amplifier OP through the integral capacitor Cf. A non-inverted input terminal of the operational amplifier OP is connected to an analog ground level (AGND). The AGND is a reference potential of the entire ΔΣ modulator 100, and the AGND is not always 0 V. The inverted input terminal of the operational amplifier OP corresponds to a first input terminal.

The quantizer 20 receives an output of the integrator 10, i.e., an output voltage Vout of the operational amplifier OP, and outputs a quantization result Qout as a result of quantizing the output voltage Vout. In other words, the quantizer 20 quantizes the output voltage Vout serving as an analog value, and converts it into the quantization result Qout serving as a digital value. The quantization result corresponds to Qout.

The quantizer 20 includes a comparator (not shown). The comparator is connected to the output terminal of the operational amplifier OP. The output voltage Vout of the operational amplifier OP is input to an input terminal of the comparator. The comparator compares the Vout with a predetermined reference value (e.g., Vth+,Vth−), and then outputs the result obtained above, i.e., the quantization result Qout to a control circuit 40 described later.

When the Vout satisfies Vout Vth+, the quantizer 20 outputs 1 as the quantization result Qout, for example. When the Vout satisfies Vout<Vth−, the quantizer 20 outputs −1 as the Qout. When the Vout satisfies Vth−≤Vout<Vth+, the quantizer 20 outputs 0 as the Qout. In this case, the quantizer 20 functions as a quantizer having a resolution of 1.5 bits.

The control circuit 40 outputs a control signal corresponding to the quantization result Qout to a D/A converter 30 (DAC 30) The control circuit 40 outputs a ΔΣ modulation result Dout simultaneously according to a result of integrating quantization results Qout obtained by quantization performed during one sampling. Specifically, when the quantizer 20 performs quantization plural times during one sampling, the ΔΣ modulation result Dout is produced at each time when the quantization is performed, as a result of integrating the quantization results Qout sequentially. Further, if the quantizer 20 is configured to perform quantization only one time during one sampling, the ΔΣ modulation result Dout may be produced based on the one-time quantization result Qout. Resolution of the quantizer 20 is not limited to 1.5 bits. The quantizer 20 may have a resolution of 1 bit or 2 bits or more.

The DAC 30 is a D/A converter connected to the integrator 10. The DAC 30 determines an amount of electric charges subtracted from the integral capacitor Cf, based on the quantization result Qout outputted from the quantizer 20, i.e., a control signal outputted from the control circuit 40. The DAC 30 has Vcm, Vrefp, and Vrefm as a reference voltage. For instance, Vcm is set to have a potential equal to the AGND, Vrefp is set to have a potential higher than the AGND, and Vrefm is set to have a potential lower than the AGND. If the AGND is 0 V, Vrefp and Vrefm will be equal in absolute value but opposite in sign (negative/positive) to each other, i.e., will be set to satisfy the relation of Vrefp=−Vrefm.

A connection between the DAC 30 and the integrator 10 will be described. The DAC 30 has a DAC capacitor Cd. A voltage source, which generates reference voltages Vrefp, Vcm, and Vrefm, is connected to one end of the DAC capacitor Cd through switches SDT, SDM, and SDB. Specifically, Vcm is connected to the one end of the DAC capacitor Cd through the switch SDM. Vrefp is connected thereto through the switch SDT. Vrefm is connected thereto through the switch SDB. By using switches SDT, SDM, and SDB, a potential at the one end of the DAC capacitor Cd is exclusively selected. Therefore, the potential is made equal to any one of Vrefp, Vrefm, and Vcm. The voltage, which is selected and determined in this way, corresponds to a DAC voltage.

The other end of the DAC capacitor Cd, which is opposite to the one end to be connected to the reference voltages, is connectable with the AGND through the switch SD2, while being connected to an intermediate point of the inverted input terminal of the operational amplifier OP and the integral capacitor Cf through the switch SD3. In other words, the DAC 30 is connectable with the integrator 10 through the switch SD3. The other end of the DAC capacitor Cd is connectable with the AGND through the switch SD2. The switch SD3 in the present embodiment corresponds to a first control switch.

When the switch SD3 is turned off, and the switch SD2 and switch SDM are turned on, voltages at both ends of the DAC capacitor Cd are set to the AGND, so that the electric charges stored in the DAC capacitor Cd are discharged to zero. In other words, the DAC capacitor Cd can be reset (Reset).

Further, when the switch SD2 is turned off, and the switch SD3 is turned on, the DAC capacitor Cd is connected to the integrator 10. Furthermore, when any one of the switches SDT, SDB and SDM is turned on, the electric charges stored in the integral capacitor Cf are drawn out according to the selected reference voltage. In other words, according to the quantization result Qout in ΔΣ modulation, feedback is performed through subtraction of the electric charges. In the case where the switch SDM is turned on, a potential at the one end of the DAC capacitor Cd does not change from when the electric charges stored in the DAC capacitance are reset. Thus, subtraction is not performed substantially, although the operation of subtracting electric charges is performed.

In the present embodiment, the DAC 30 and the control circuit 40 are configured as follows: in the case where the subtraction of electric charges is performed by using the DAC capacitor Cd, if the quantization result obtained by quantizer 20 satisfies Qout=1, the switch SDT will be turned on. If the quantization result satisfies Qout=0, the switch SDB will be turned on. If the quantization result satisfies Qout=−1, the switch SDM will be turned on. In other words, the DAC 30 in the present embodiment functions as a D/A converter having a resolution of 1.5 bits (three levels). Resolution of the DAC 30 is not limited to 1.5 bits. The DAC 30 may have a resolution of 1 bit or 2 bits or more.

The sampling capacitor Cs is inserted between an input terminal of the analog signal Vin and the integrator 10. Specifically, one end of the sampling capacitor Cs is connected to the input terminal of the analog signal Vin through a switch SS1, and the other end thereof is connected to an intermediate point of the inverted input terminal of the operational amplifier OP and the integral capacitor Cf through a switch SS3. In other words, if the switch SS3 is turned on, the other end on an operational amplifier OP side of the sampling capacitor Cs will be connected to the integral capacitor Cf, electrically. Further, an intermediate point of the sampling capacitor Cs and the switch SS1 is connectable with the AGND through a switch SS4, and an intermediate point of the sampling capacitor Cs and the switch SS3 is made connectable with the AGND through the switch SS2.

The switch SS1 and the switch SS2 are operated in synchronization with each other at the same phase. Further, the switch SS3 and the switch SS4, which are also operated in synchronization with each other at the same phase, are operated with switching-on and off thereof reversed to those of the switch SS1 and the switch SS2. When the switch SS1 and the switch SS2 are turned on, and the switch SS3 and the switch SS4 are turned off, the other end of the sampling capacitor Cs is connected to the AGND, although the sampling capacitor Cs is electrically disconnected from the integrator 10. As a result, electric charges corresponding to the analog signal Vin are stored in the sampling capacitor Cs. When the switch SS1 and the switch SS2 are turned off, and the switch SS3 and the switch SS4 are turned on, the electric charges stored in the sampling capacitor Cs are transmitted to the integral capacitor Cf. The switch SS3 in the present embodiment corresponds to a second control switch.

The switch SS1 and the switch SS2 are operated in synchronization with each other at the same phase, and the timing when the switch SS1 and the switch SS2 are switched on and off may not have completely the same phase. A time difference may be provided therebetween, as necessary. The timing associated with switching-on and off of the switch SS3 and the switch SS4 is the same as the timing of the switch SS1 and the switch SS2. Further, the switch SS1 and switch SS2, and the switch SS3 and the switch SS4 are operated in the state where their switching-ons and offs are reversed from each other. Incidentally, for example, a period in which the switch SS1 and the switch SS4 or the switch SS2 and the switch SS3 are turned off simultaneously may be provided, in a process where those switches are switched between on and off. Herein, the switch SS1 and the switch SS4 are connected to the same end of sampling capacitor Cs.

The ΔΣ modulator 100 in the present embodiment performs subtraction of electric charges, which is performed by using the DAC 30, plural times during one sampling in ΔΣ modulation. Thus, during the same one-time sampling performed by using the sampling capacitor Cs, the ΔΣ modulator 100 can perform the subtraction of electric charges with substantially higher resolution, compared with the conventional ΔΣ modulator does. In the case where a driver circuit for driving the sampling capacitor Cs is provided in a previous stage of the ΔΣ modulator 100, it may be possible to match a sampling frequency to operating speed of the driver circuit and simultaneously perform the feedback, while keeping a short period, by using the DAC 30 of the ΔΣ modulator 100, even if the operating speed of the driver circuit restricts the sampling frequency. In other words, even if the driver circuit is constituted by a single-ended or pseudo differential circuit whose limit operating speed is relatively low, the ΔΣ modulator 100 can perform high-speed and high-resolution ΔΣ modulation, without being restricted by the operating speed of the driver circuit.

A specific operation of the ΔΣ modulator 100 will be described with reference to FIG. 2. In a timing chart shown in FIG. 2, a horizontal axis indicates time, and the timing chart shows ON/OFF states of each switch. A High period indicates the state where a switch is turned on, and a Low period indicates the state where a switch is turned off. The present embodiment and other embodiments described later show values of Qout and Dout as an example, but the values of Qout and Dout can be changed depending on the analog signal Vin to be inputted.

Figure 2:
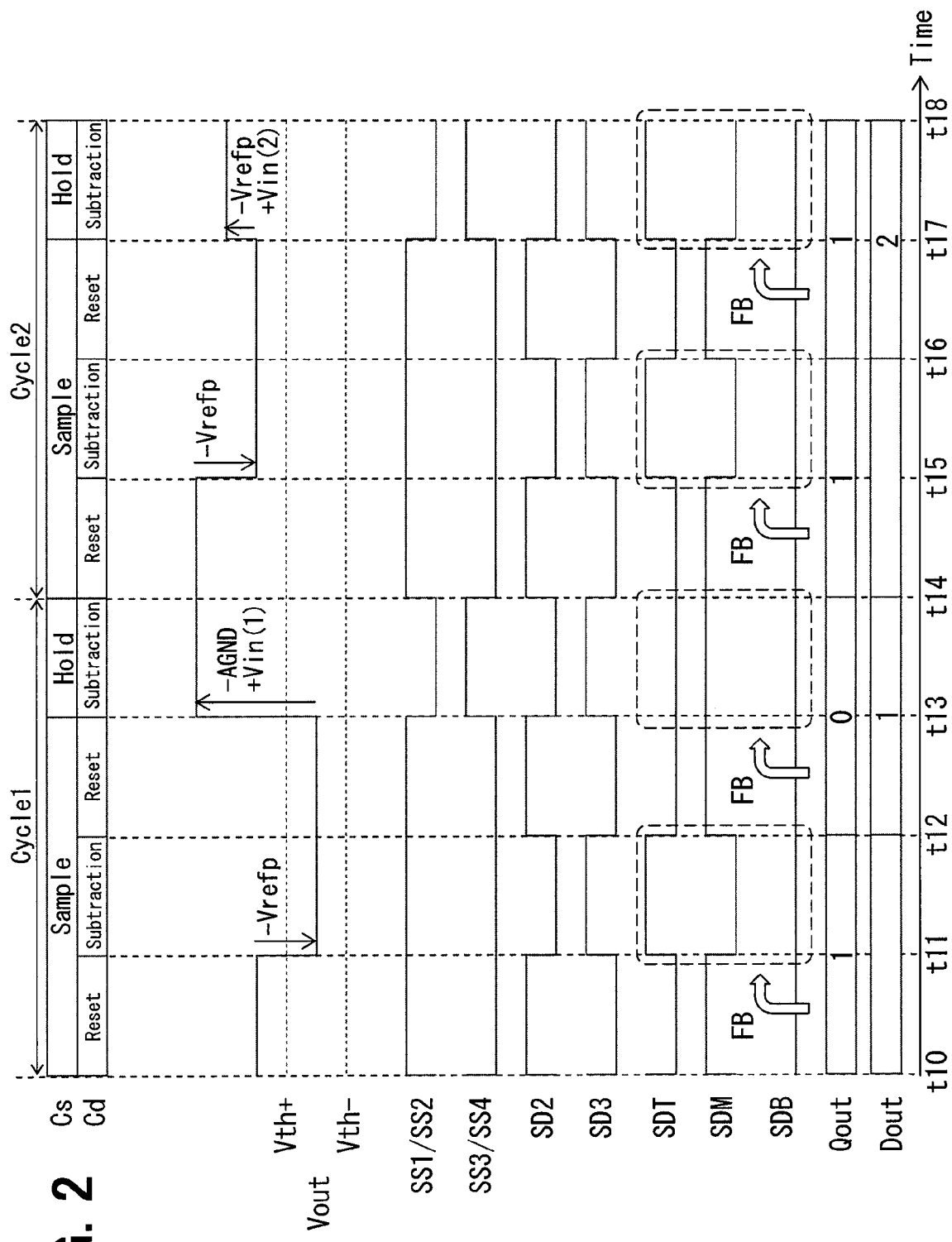
FIG. 2 is a timing chart showing an operation of the ΔΣ modulator in accordance with the first embodiment.

As shown in FIG. 2, at time t10, when the switch SS3 and the switch SS4 are turned off, and the switch SS1 and the switch SS2 are turned, sampling of the analog signal Vin is started through the sampling capacitor Cs.

At the same time when the sampling is started, the switch SD3 is turned off at time t10. Thus, the DAC 30 is electrically disconnected from the integrator 10. Further, when the switch SD2 is turned on, the switches SDT and SDB of the DAC 30 turn into an OFF state. At that time, when the switch SDM is turned on, both ends of the DAC capacitor Cd are connected to the AGND. In other words, the DAC capacitor Cd turns into a reset state.

At time t10, an output voltage Vout of the operational amplifier OP is quantized by quantizer 20 to output a quantization result Qout to the control circuit 40. Since Vout at time t10 satisfies Vout Vth+, quantizer 20 outputs 1 as Qout. Subsequently, at time t11, feedback is performed to the integrator 10 by using the DAC 30, based on the quantization result Qout. Specifically, based on the quantization result Qout, the control circuit 40 turns on the switch SD3, while turning off the switch SD2, so that the integrator 10 is electrically connected to the DAC 30. Furthermore, at the same time when the switch SDM is turned off, the switch SDT is turned on. Thus, electric charges corresponding to the quantization result Qout=1 are subtracted through the DAC 30. As shown in FIG. 2, the output voltage Vout of the operational amplifier OP is reduced by only Vrefp, resulting from the subtraction of electric charges at time t11. Although a change in an amount of Vout is determined by a capacitance ratio of the DAC capacitor Cd to an integral capacitance Cf, the description about the capacitance ratio is omitted for simplicity, and the change in an amount of Vout is described as −Vrefp in FIG. 2. In the timing chart of other embodiments described later, the description about the capacitance ratio is omitted similarly.

The feedback of the quantization result Qout, i.e., the subtraction is performed in synchronization with a clock used as a timing reference for controlling operation of the ΔΣ modulator 100. A feedback cycle, i.e., half of an operation cycle of the switches associated with operation of the DAC 30, such as the switch SD2 and the switch SD3, is referred to as unit time based on a clock frequency.

In the general configuration, since the time required for one sampling is equivalent to the unit time based on a clock frequency, the sampling is completed at time t11, and then changed into a HOLD state. On the other hand, the ΔΣ modulator 100 in the present embodiment has the switch SS3 and the switch SS4. Therefore, the sampling capacitor Cs may be electrically disconnected from the integrator 10 and the DAC 30 to control the sampling capacitor Cs independently from operations of the integrator 10 and the DAC 30. It may be possible to continue sampling of the analog signal Vin after time t11, without completing the sampling at time t11 depending on the operation of DAC 30.

After the subtraction is performed by using the DAC 30, driving operation of the switch at time t12 is the same as the driving operation at time t10, except that the sampling performed by using the sampling capacitor Cs is continued. Specifically, when the switch SD3 is turned off, the DAC 30 is electrically disconnected from the integrator 10. In this condition, when the switch SD2 is turned on, the switches SDT and SDB of the DAC 30 turn into an OFF state. Thus, when the switch SDM is turned on, both ends of the DAC capacitor Cd are connected to the AGND. In other words, the DAC capacitor Cd turns into a reset state.

After a first subtraction is performed between time t11 and time t12, the output voltage Vout of the operational amplifier OP is quantized at time t12 by the quantizer 20. In other words, between time t10 to time t14, i.e., during one sampling cycle of ΔΣ modulation, a second quantization is performed. Since Vout at time t12 satisfies Vth−<Vout<Vth+, the quantizer 20 outputs 0 as Qout.

After that, feedback is performed at time t13 based on the quantization result Qout corresponding to the second quantization. Specifically, in a similar manner to each switch operated at time t11, when the switch SD2 is turned off, and the switch SD3 is turned on, the integrator 10 and DAC 30 are electrically connected. Additionally, if the switch SDM remains turned on, the subtraction corresponding to the quantization result Qout=0 will be performed. However, if the quantization result satisfies Qout=0, the AGND will be chosen as the DAC voltage. Therefore, subtraction is not performed substantially, although operation of the subtraction is performed.

At time t13, when the subtraction is performed, the switch SS1 and the switch SS2 are turned off, and the switch SS3 and the switch SS4 are turned on at the same time. In other words, the input signal Vin is disconnected from the sampling capacitor Cs electrically, and the sampling capacitor Cs and the integrator 10 are connected. Consequently, electric charges stored in the sampling capacitor Cs based on the input signal Vin are transmitted to the integral capacitor Cf during a hold period.

As shown in FIG. 2, at time t13, the second subtraction is performed, and the electric charges are transmitted from the sampling capacitor Cs. While the AGND is subtracted from the output voltage Vout of the operational amplifier OP, the input signal Vin (Vin (1) described in FIG. 2), which has been sampled between time t10 and time t13, is added.

The period between time t10 and time t13 shown in FIG. 2 is a sampling period in which electric charges based on the input signal Vin are stored in the sampling capacitor Cs in the present embodiment. The sampling period in the present embodiment corresponds to three times the unit time based on a clock frequency. Further, the period between time t10 and time t14 corresponds to one sampling cycle of ΔΣ modulation in the present embodiment, and feedback of the quantization result Qout is performed twice during the one sampling cycle. Consequently, in the present embodiment, the sampling is performed once, and the feedback is performed twice per one sampling cycle of ΔΣ modulation.

Operation of the second sampling cycle between time t14 and time t18 is the same as the operation of the first sampling cycle between time t10 and time t14. The feedback performed between time t14 and time t18 is as follows: electric charges are stored in the sampling capacitor Cs based on the input signal Vin sampled between time t10 and time t13, and then the electric charges are transmitted to the integrator 10 between time t13 and time t14. The feedback is performed based on the transmitted result. By repeating the same operations after time t18, it is possible to perform continuous operation of ΔΣ modulation.

An example of effects obtained by employing the ΔΣ modulator 100 in the present embodiment will be described.

Since the ΔΣ modulator 100 in the present embodiment includes the second control switch, i.e., the switch SS3, it is possible to perform the sampling of the analog signal Vin and the feedback operation performed by using the DAC 30 independently from each other, when the switch SS3 is turned off. In the present embodiment, it may be possible to perform the feedback a plurality of times during one sampling, so that it may possible to perform feedback more times during the same sampling period, compared with the ΔΣ modulator in the related art that performs feedback once during one sampling. In other words, it is possible to improve resolution of quantization by using the ΔΣ modulator.

A frequency for sampling the analog signal Vin, i.e., a sampling frequency is restricted by operating speed of the driver circuit that is disposed in a previous stage of the ΔΣ modulator to drive the sampling capacitor. If the ΔΣ modulator 100 in the present embodiment is employed, it may possible to perform the feedback plural times during one sampling. Therefore, it may be possible to perform feedback of the quantization result at high speed, even if the driver circuit is operated at relatively low speed, so that it is possible to improve resolution of the ΔΣ modulator.

Furthermore, the DAC 30 in the present embodiment is configured by single DAC capacitor Cd. It may be possible to improve resolution of ΔΣ modulation by performing feedback plural times, while eliminating errors of ΔΣ modulation resulting from variations in the DAC capacitance. Accordingly, it is possible to achieve high-resolution feedback in ΔΣ modulation without being affected by variations in a capacitance element, compared with a DAC configured by plural DAC capacitances, which is used for a typical multi-bit ΔΣ modulator.

First Modification

Figure 3:
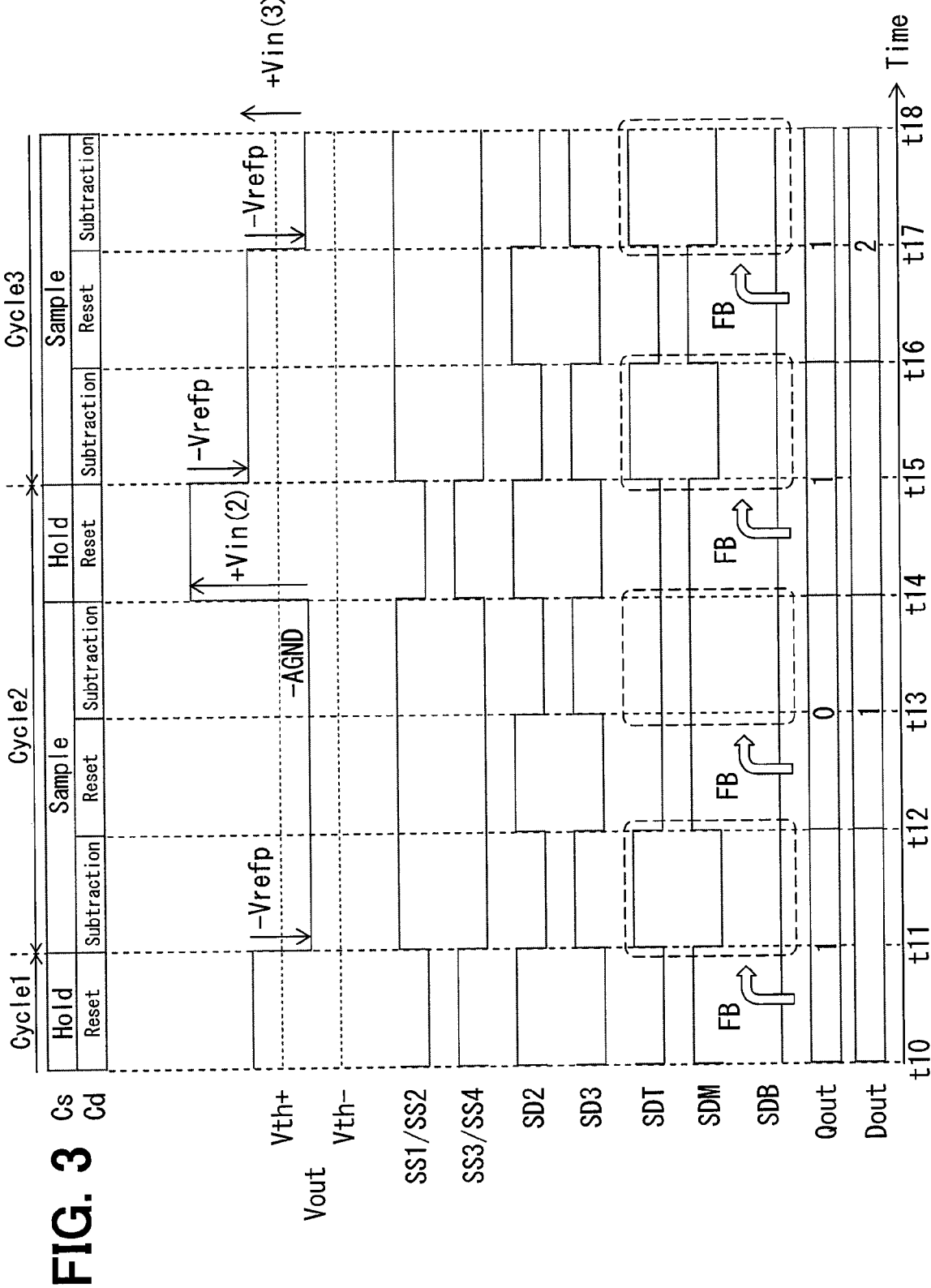
FIG. 3 is a timing chart showing an operation of a ΔΣ modulator in accordance with a first modification.

As shown in FIG. 3, phases associated with driving operation of the switches SS1, SS2, SS3, and SS4 may be delayed, compared with the above-mentioned embodiment. In an example shown in FIG. 3, the phases associated with driving operation of the switches SS1, SS2, SS3, and SS4 are delayed by only the unit time, compared with the example shown in FIG. 2. In such an example, the timing at which the switch SS3 and the switch SD3 are turned off does not overlap the timing at which the switch SS2 and the switch SD2 are turned off, so that it is possible to reduce the influence of charge injection, which occurs due to ON/OFF of a switch.

Figure 4:
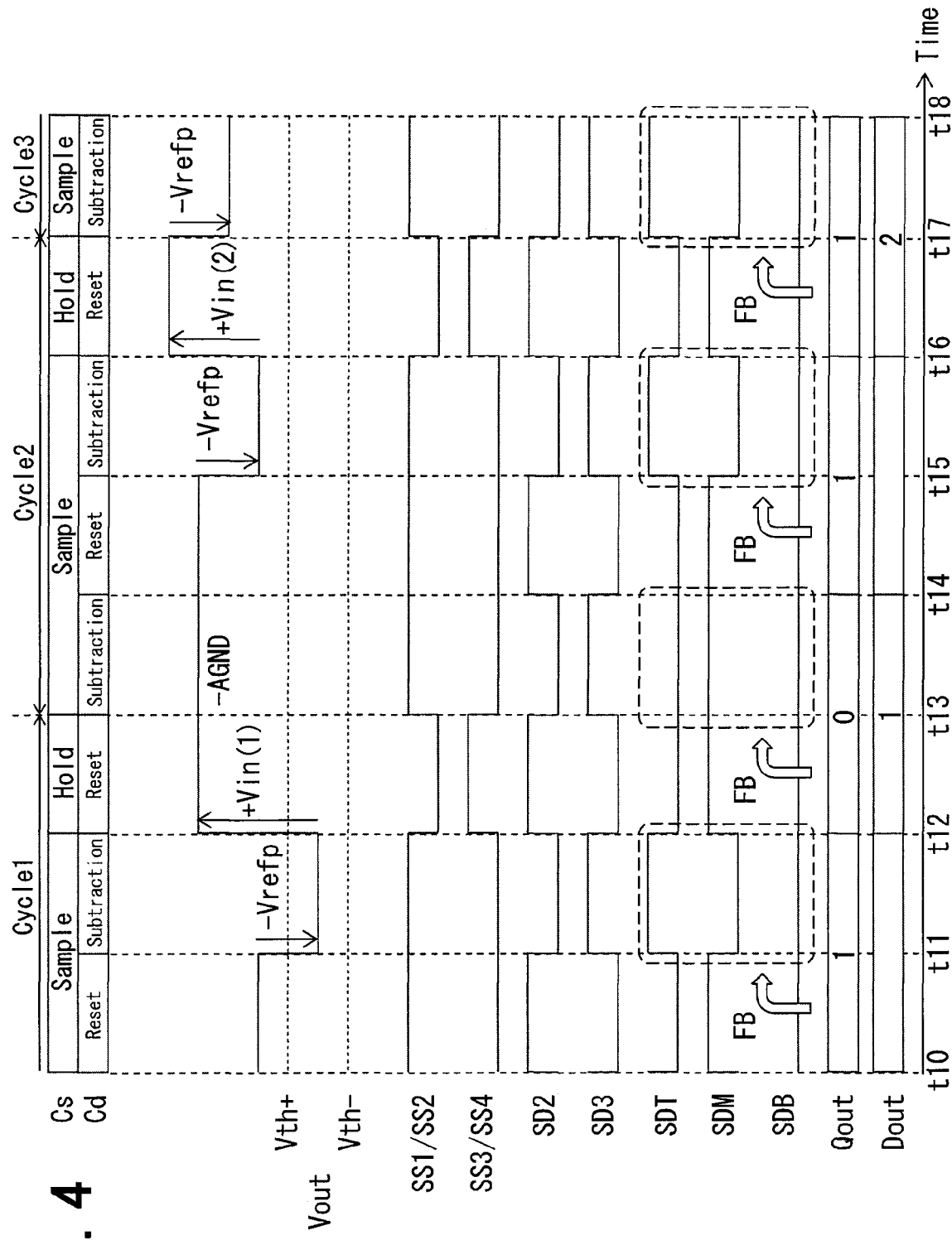
FIG. 4 is a timing chart showing an operation of the ΔΣ modulator in accordance with the first modification.

Further, as shown in FIG. 4, the phases associated with driving operation of the switches SS1, SS2, SS3, and SS4 may be advanced, compared with the above-mentioned embodiment. In an example shown in FIG. 4, the phases associated with driving operation of the switches SS1, SS2, SS3, and SS4 are advanced by only the unit time, compared with the example shown in FIG. 2. In such a mode, like the example shown in FIG. 3 in which the phases associated with driving operation of the switches SS1, SS2, SS3, and SS4 are delayed, it is possible to reduce the influence of charge injection, which occurs due to the switch operation. In addition to this, after the feedback is completed, it is possible to obtain the output voltage Vout at a timing earlier than that of the example shown in FIG. 3. This enables the quantizer 20 to quantize the output voltage Vout at an earlier timing. Further, this makes it easier to secure the time from when the quantization is performed to when the feedback is performed by using the DAC 30. It may be possible to relieve a demand for quantization speed of the quantizer 20.

Second Modification

Figure 5:
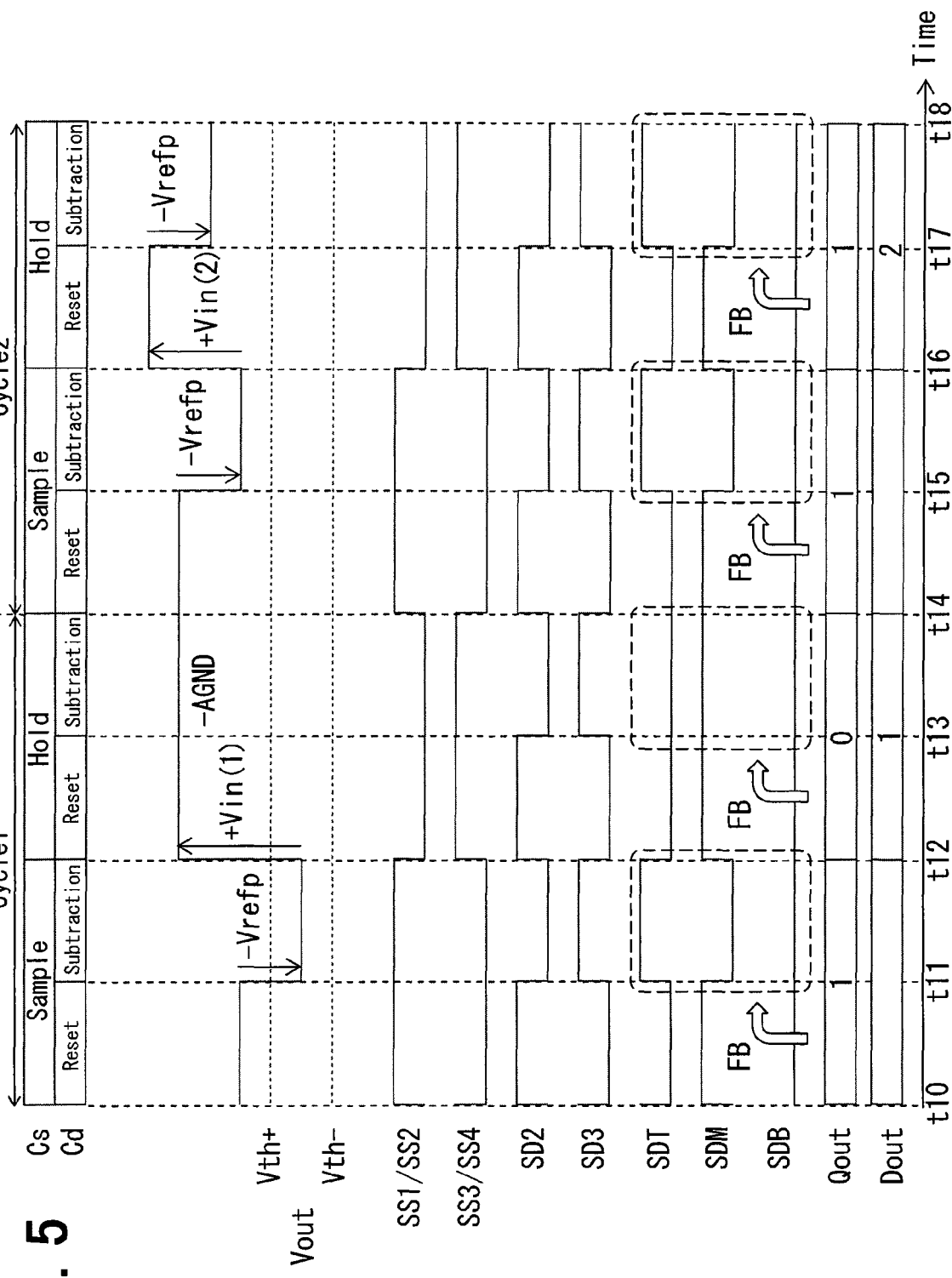
FIG. 5 is a timing chart showing an operation of a ΔΣ modulator in accordance with a second modification.

The first embodiment, mentioned above, describes an example in which a sampling period is three times the unit time (from time t10 to time t13) based on a clock frequency, and a hold period is the same as the unit time. the sampling period may be set arbitrary, because the sampling capacitor Cs, the integrator 10, and the DAC 30 may be controlled independently from one another by using the switch SS3. For instance, as shown in FIG. 5, both the sampling period and the hold period may be twice the unit time.

For instance, it is assumed that a circuit provided in a previous stage of the $\Delta\Sigma$ modulator 100 is configured by a switched capacitor circuit whose operating speed is low. To match the low speed operation of the switched capacitor circuit in the previous stage, it is necessary to secure a long hold period, in addition to the sampling period of $\Delta\Sigma$ modulator 100, enough to prevent operation of the $\Delta\Sigma$ modulator 100 from affecting an output of the switched capacitor circuit in the previous stage, when the sampling period and the hold period are switched. Like the present modification, the sampling period and the hold period are set to twice the unit time. It may be possible to achieve high-speed feedback of $\Delta\Sigma$ modulation, even if the switched capacitor circuit in the previous stage is operated at low speed.

Third Modification

It is assumed that differential analog signals Vin+ and Vin− are employed as an input signal. When electric charges based on Vin+ are stored in the sampling capacitor Cs, and the electric charges are transmitted to the integral capacitor Cf, the second modification may be configured such that Vin−, i.e., an inversion signal of Vin+ is input as a potential to be connected to the sampling capacitor Cs through the switch SS4, instead of the AGND, which is described in the second modification.

In the present modification, when the electric charges are transmitted to the integral capacitor Cf from the sampling capacitor Cs, Vin−, i.e., an inversion signal of Vin+ is employed. Assumed that the sampling capacitor Cs has the same value as the second modification has, it may be possible to transmit electric charges corresponding to substantially twice the analog signal Vin+ to the integral capacitor Cf. In the present modification, the same electric charges will be transmitted, even if a capacitance value of the sampling capacitor Cs decreases to half the capacitance value of the second modification. It may be to reduce a load of the circuit in the previous stage for driving the sampling capacitor Cs, or to decrease the influence of thermal noise, resulting from the sampling performed by using the sampling capacitor Cs.

Fourth Modification

The first embodiment and the first and second modifications, mentioned above, show an example in which the quantizer 20 operates at 1.5 bits. In the above-mentioned example, as shown in FIGS. 2 through 5, for the electric charges sampled during one sampling cycle, quantization is performed plural times. Further, feedback is performed plural times corresponding to the number of times of quantization.

In the present modification, a quantizer having a resolution of 2 bits or more is employed as the quantizer 20. An operation of performing $\Delta\Sigma$ modulation will be described such that, during one sampling, quantization is performed once by quantizer 20 and feedback is performed plural times by using the DAC 30.

The $\Delta\Sigma$ modulator 100 in the present modification has the same configuration as the $\Delta\Sigma$ modulator 100 described in the first embodiment, except for the quantizer 20. Further, as for the quantizer 20 serving as a different element, a quantizer having a resolution of 2 bits or more may be employed.

For instance, a mode whose sampling period is three times the unit time, like the first embodiment, will be described with reference to FIG. 6. Like the first embodiment, for the output voltage Vout at time t10, quantization is performed, and sampling is started simultaneously at time t10. The sampling is continued until time t13, and feedback is performed twice between time t11 and time t13 in total. From time t10 to time t14, i.e., until the time when the next sampling period is started, no quantization is performed, and feedback is performed twice based on the result obtained by the one-time quantization at time t10.

Figure 6:
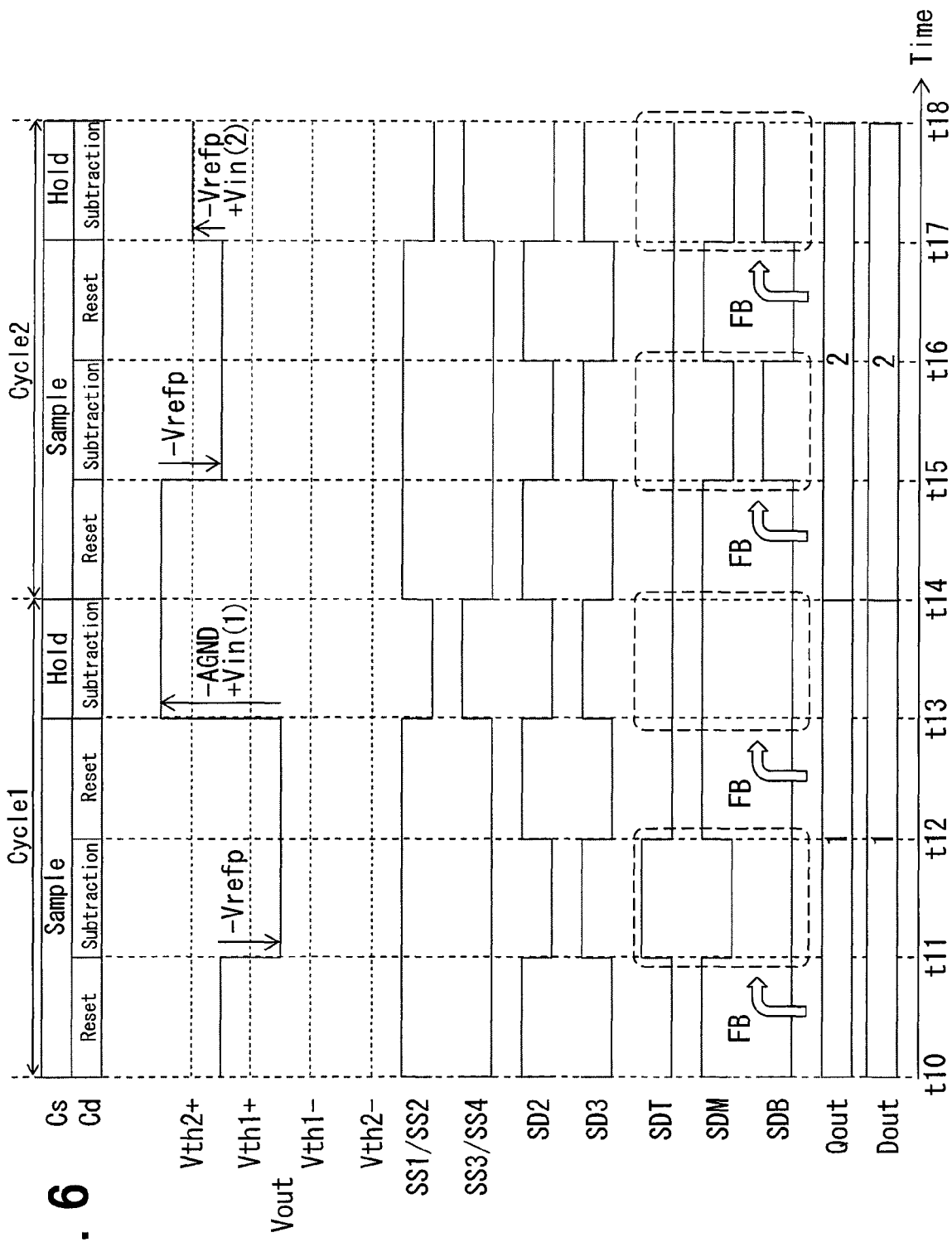
FIG. 6 is a timing chart showing an operation of a ΔΣ modulator in accordance with a fourth modification.

In an example of FIG. 6, the quantizer 20 is a quantizer having a resolution of 2.5 bits (five levels), and has Vth1+, Vth1−, Vth2+, and Vth2− as a reference value of quantization. When Vout satisfies Vout≥Vth2+, the quantizer 20 outputs 2 as Qout. When Vout satisfies Vth1+≤Vout<Vth2+, the quantizer 20 outputs 1 as Qout. When Vout satisfies Vth1−≤Vout<Vth1+, the quantizer 20 outputs 0 as Qout. When Vout satisfies Vth2−≤Vout<Vth1−, the quantizer 20 outputs −1 as Qout. When Vout satisfies Vout<Vth2−, the quantizer 20 outputs −2 as Qout.

At time t10, quantization is performed to obtain 1 as the quantization result Qout, and feedback is performed twice between time t10 and time t14. In the two feedbacks, subtraction based on a reference voltage Vrefp and subtraction based on a reference voltage Vcm are performed one by one using the DAC 30. Similarly, at time t14, quantization is performed to obtain 2 as the quantization result Qout, and feedback is performed twice between time t14 and time t18. In the two feedbacks, subtraction based on the reference voltage Vrefp is performed twice.

This example shows that the sampling period is three times the unit time, when quantization is performed once during one sampling by a quantizer having a resolution of 2 bits or more. During one sampling, the quantizer having a resolution of 2 bits or more is used to perform quantization once. Using the one-time quantization result Qout, feedback is performed plural times. It may be possible to achieve high resolution, compared with the conventional ΔΣ modulator, like the first embodiment and the first modification.

Figure 7:
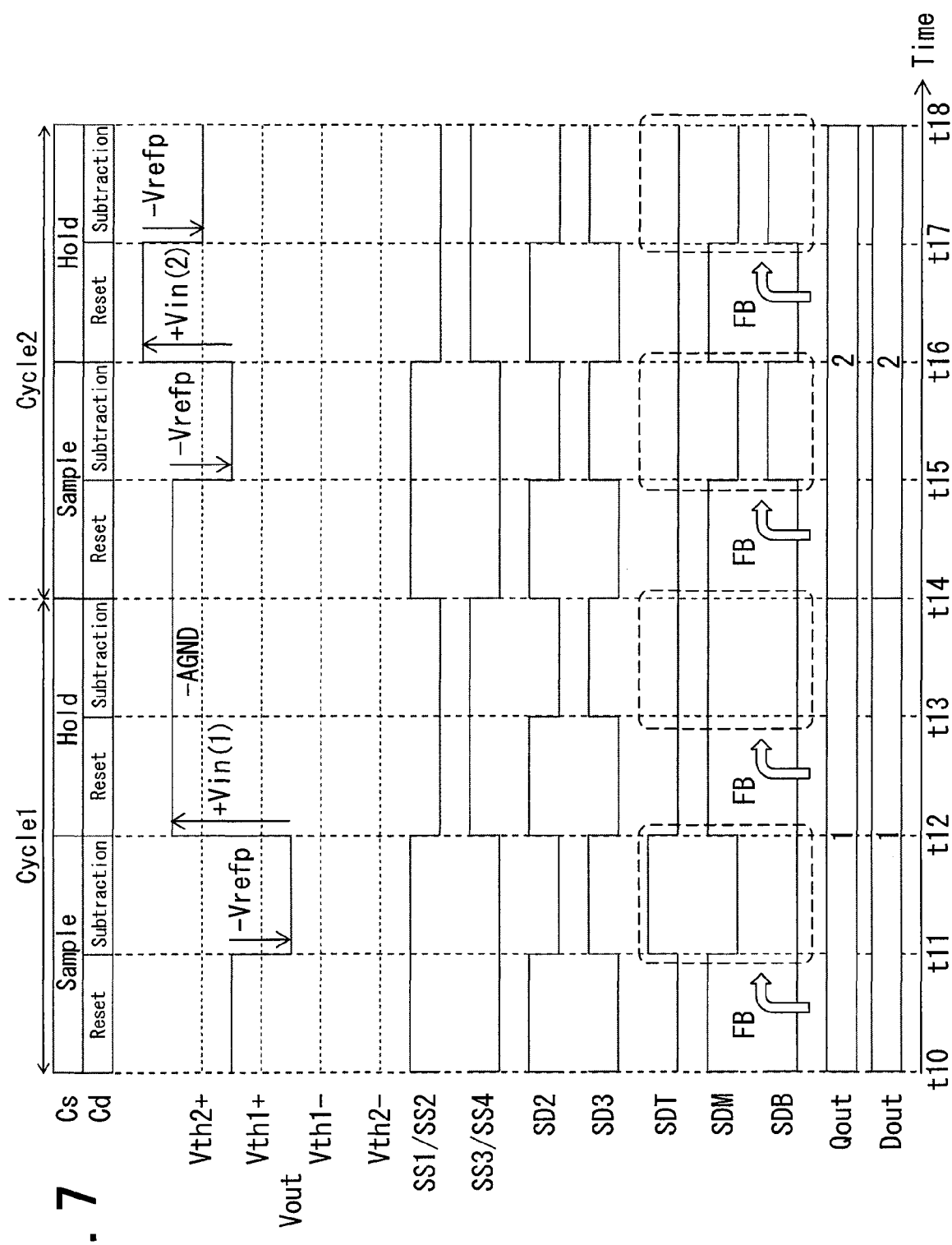
FIG. 7 is a timing chart showing an operation of the ΔΣ modulator in accordance with the fourth modification.

Further, a mode whose sampling time is twice the unit time, like the second modification, will be described with reference to FIG. 7, as another example. Like the second modification, for the output voltage Vout at time t10, quantization is performed, and sampling is started simultaneously at time t10. The sampling is continued until time t12. A period between time t12 and time t14 corresponds to a hold period. At time t11 and time t13 in the hold period, feedback is performed twice, totally. From time t10 to time t14, i.e., until the time when the next sampling period is started, no quantization is performed. Based on the one-time quantization result obtained at time t10, feedback is performed twice. Between time t14 and time t18, a similar operation to that between time t10 and time t14 is repeated.

This example shows that the sampling period is twice the unit time, when quantization is performed once during one sampling by a quantizer having a resolution of 2 bits or more. In the example, it is possible to achieve high resolution, like the second modification, compared with the ΔΣ modulator in the related art.

Second Embodiment

Figure 8:
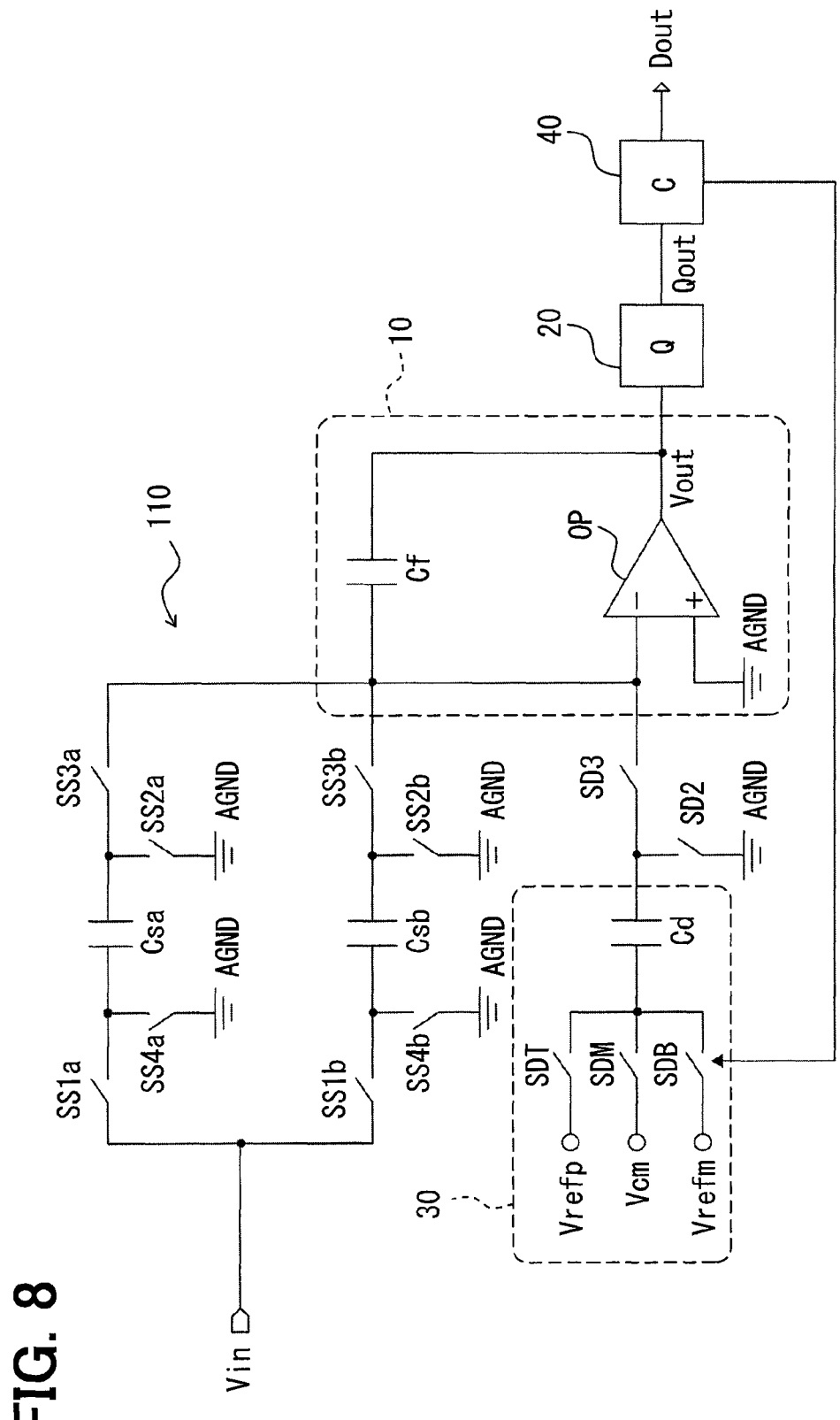
FIG. 8 is a circuit diagram showing a schematic configuration of a ΔΣ modulator in accordance with a second embodiment.

The first embodiment and the first to fourth modifications describe an example in which the ΔΣ modulator 100 includes only one sampling capacitor Cs. For instance, the ΔΣ modulator 110 may be configured to have two sampling capacitors Csa and Csb as shown in FIG. 8, in the case where the driver circuit in the previous stage operates at low speed. According to this, by shifting sampling periods of the two sampling capacitors, it is possible to use the two sampling capacitors alternately to sample the analog signal Vin, which is to be input from the driver circuit.

The ΔΣ modulator 110 in the present embodiment includes sampling capacitors Csa and Csb between an input terminal of the analog signal Vin and the integrator 10. Herein, the sampling capacitors Csa and Csb are connected in parallel with each other. Like the first embodiment, each of the sampling capacitors Csa and Csb, which are connected in parallel with each other, is configured to have the sampling capacitor Cs and four switches (SS1, SS2, SS3, SS4), each being connected to the sampling capacitor Cs.

Specifically, the sampling capacitor Csa is inserted between an input terminal of the analog signal Vin and an intermediate point of the integral capacitor Cf and an inverted input terminal of operational amplifier OP. The switch SS1a is inserted between the input terminal of the analog signal Vin and the sampling capacitor Csa. The switch SS3a is inserted between the sampling capacitor Csa and the integrator 10. An intermediate point of the switch SS1a and the sampling capacitor Csa is made connectable with the AGND, serving as a reference potential, through the switch SS4a. An intermediate point of the switch SS3a and the sampling capacitor Csa is made connectable with the AGND through the switch SS2a.

Similarly, the sampling capacitor Csb is inserted between the input terminal of the analog signal Vin and an intermediate point of the integral capacitor Cf and the inverted input terminal of the operational amplifier OP. The switch SS1b is inserted between the input terminal of the analog signal Vin and the sampling capacitor Csb. The switch SS3b is inserted between the sampling capacitor Csb and the integrator 10. An intermediate point of the switch SS1b and the sampling capacitor Csb is made connectable with the AGND through the switch SS4b. An intermediate point of the switch SS3b and the sampling capacitor Csb is made connectable with the AGND through the switch SS2b.

In the present embodiment, the two sampling capacitors Csa and Csb are set to have the same capacitance value as each other, although capacitance values thereof may be set optionally. Further, the integrator 10, the quantizer 20, and DAC 30 are configured to have the same configuration as in the first embodiment and the first to fourth modifications, except for the above-mentioned difference, i.e., the configuration of the sampling capacitors Csa and Csb and switches connected to the sampling capacitors.

Figure 9:
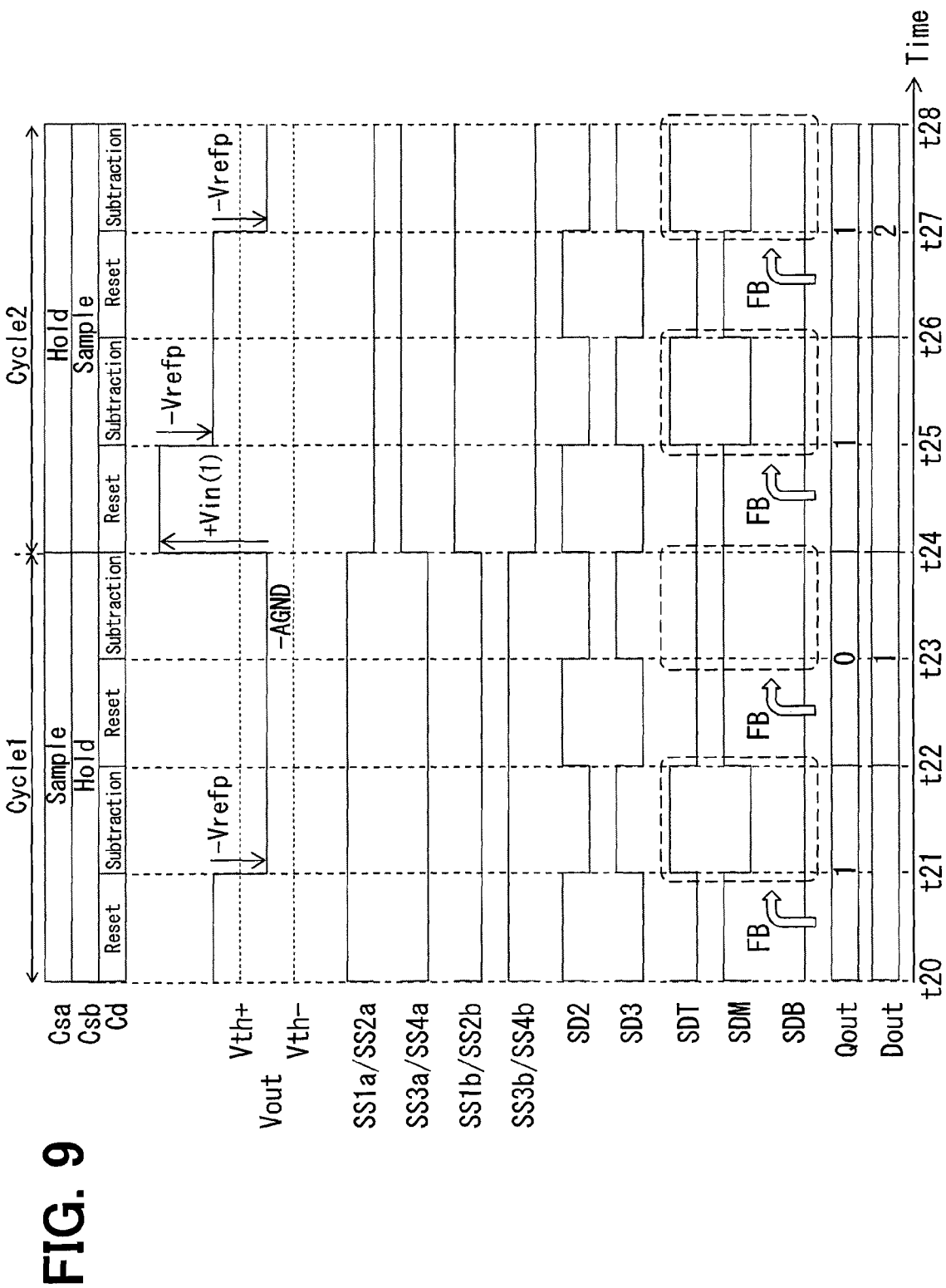
FIG. 9 is a timing chart showing an operation of the ΔΣ modulator in accordance with the second embodiment.

An operation of the ΔΣ modulator 110 in the present embodiment will be described with reference to FIG. 9. In a timing chart shown in FIG. 9, a horizontal axis indicates time, and the timing chart shows ON/OFF states of each switch. An operation between time t20 and time t28 corresponds to the operation between time t10 and time t18 in the first embodiment.

First, in the present embodiment, a part of the analog signal Vin is sampled into the sampling capacitor Csa. As shown in FIG. 9, at time t20, when the switch SS3a and the switch SS4a are turned off, and the switch SS1a and the switch SS2a are turned on, sampling of the analog signal Vin is started. At this time, since the switch SS1b is turned off, sampling is not performed in the sampling capacitor Csb. Herein, the switch SS1b functions as a control switch on a sampling capacitor Csb side.

At the same time when the sampling is started, the switch SD3 is turned off at time t20. Thus, the DAC 30 is disconnected from the integrator 10, electrically. Further, when the switch SD2 is turned on, the switches SDT and SDB of the DAC 30 turn into an OFF state. When the switch SDM is turned on, both ends of the DAC capacitor Cd are connected to the AGND. In other words, the DAC capacitor Cd turns into a reset state.

Further, ΔΣ modulation is performed based on the signal that has been sampled before time t20, and as a result of the ΔΣ modulation, the output voltage Vout of the operational amplifier OP, which has been obtained immediately before time t20, is quantized at time t20 to produce the quantization result Qout.

After that, based on the quantization result Qout, feedback is performed to the integrator 10 at time t21 by using the DAC 30. Specifically, based on the quantization result Qout, the control circuit 40 turns on the switch SD3, while turning off the switch SD2, so that the integrator 10 and DAC 30 are electrically connected with each other. Furthermore, at the same time when the switch SDM is turned off, the switch SDT is turned on. Thus, electric charges corresponding to the quantization result Qout=1 are subtracted through the DAC 30.

As for a driving operation of the switches after the subtraction performed by using the DAC 30, the driving operation at time t22 is the same as the driving operation at time t20, except that the sampling is continued by using the sampling capacitor Csa. Specifically, when the switch SD3 is turned off, the DAC 30 is disconnected from the integrator 10, electrically. In this condition, when the switch SD2 is turned on, the switches SDT and SDB of the DAC 30 turn into an OFF state. When the switch SDM is turned on, both ends of the DAC capacitor Cd are connected to the AGND. In other words, the DAC capacitor Cd turns into a reset state.

After the first subtraction is performed between time t21 and time t22, the output voltage Vout of the operational amplifier OP is quantized by quantizer 20 at time t22. In other words, the second quantization is performed between time t20 and time t24, i.e., during one sampling cycle in the ΔΣ modulation. Since Vout a time t22 satisfies Vth–≤Vout<Vth+, the quantizer 20 outputs 0 as Qout.

In the present embodiment, the sampling performed by using the sampling capacitor Csa is completed at time t24, and the sampling performed by using the sampling capacitor Csb is started. As shown in FIG. 9, when the switch SS1a and the switch SS2a are turned off, and the switch SS3a and the switch SS4a are turned on, electric charges stored in the sampling capacitor Csa are transmitted to the integral capacitor Cf. Further, the sampling capacitor Csa is disconnected from the input terminal of the analog signal Vin, electrically. At the same time, when the switch SS1b and the switch SS2b are turned on, and the switch SS3b and the switch SS4b are turned off, the input terminal of the analog signal Vin is connected to the sampling capacitor Csb, electrically. In other words, the sampling performed by using the sampling capacitor Csb is started.

An operation between time t24 and time t28 is the same as the operation between time t20 and time t24, except that the sampling capacitor for sampling the analog signal Vin is changed from the sampling capacitor Csa to the sampling capacitor Csb. Therefore, the detailed description thereof is omitted. As described above, since the determination whether to turn on or turn off any one of switches SDT, SDM, and SDB depends on the quantization result Qout. Therefore, an operation of the switches SDT, SDM, and SDB is not limited to the example shown in FIG. 9.

If the ΔΣ modulator 110 in the present embodiment is employed, it is possible to sample one analog signal Vin alternately by using the two sampling capacitors Csa and Csb whose sampling periods are shifted from each other. Accordingly, even if the driver circuit in the previous stage is operated at a low speed, it is possible to elongate the sampling period according to the operating speed of the driver circuit, thereby making it possible to perform the feedback at high speed by using the DAC 30.

Third Embodiment

The first embodiment and the second embodiment show an example in which single integrator 10 is used to configure a ΔΣ modulator. In other words, the ΔΣ modulators 100 and 110 in the first embodiment and the second embodiment each are a first-order ΔΣ modulator. On the other hand, the present embodiment will describe an example in which a second-order ΔΣ modulator is configured.

A configuration of a ΔΣ modulator 120 in the present embodiment will be described with reference to FIG. 10.

Figure 10:
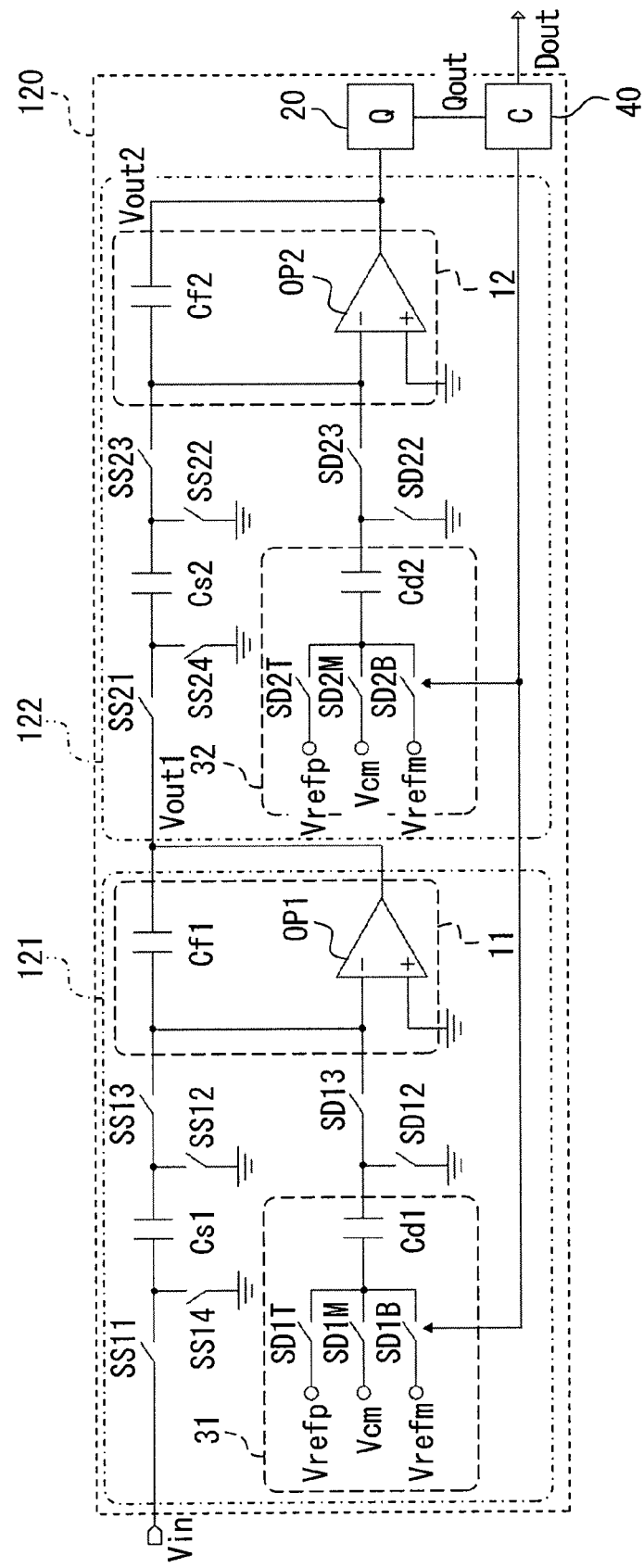
FIG. 10 is a circuit diagram showing a schematic configuration of a ΔΣ modulator in accordance with a third embodiment.

As shown in FIG. 10, the ΔΣ modulator 120 is configured such that a second modulation circuit 122 is inserted between an output terminal of the operational amplifier OP and the quantizer 20. Herein, the operational amplifier OP is included in the ΔΣ modulator 100 described in the first embodiment. For convenience, a portion corresponding to a previous stage of the quantizer 20 in the ΔΣ modulator 100 of the first embodiment is referred to as a first modulation circuit 121. Herein, the portion is disposed between the input terminal of the analog signal Vin and the second modulation circuit 122.

The first modulation circuit 121 includes a first integrator 11, a first D/A converter 31 (hereinafter, referred to as a first DAC 31), and a first sampling capacitor Cs1. The first integrator 11, the first DAC 31, and the first sampling capacitor Cs1 correspond to the integrator 10, the DAC 30, and the sampling capacitor Cs in the first embodiment, respectively. Further, a connection therebetween is also the same as the connection in the first embodiment.

In other words, the first integrator 11 has a first operational amplifier OP1 and a first integral capacitor Cf1. An output terminal of the first operational amplifier OP1 is connected to a first input terminal (=inverted input terminal) through the first integral capacitor Cf1, and a second input terminal (=non-inverted input terminal) is connected to the AGND serving as a reference potential.

The first DAC 31 has a first DAC capacitor Cd1. A voltage source for generating reference voltages Vrefp, Vcm, and Vrefm is connected to an end of the first DAC capacitor Cd1 through switches SD1T, SD1M, and SD1B. Specifically, Vcm (e.g., the AGND) is connected to one end of the first DAC capacitor Cd1 through the switch SD1M, Vrefp is connected thereto through the switch SD1T, and Vrefm is connected thereto through the switch SD1B. The potential at the one end of the first DAC capacitor Cd1 is made equal to any one of Vrefp, Vcm, and Vrefm. Herein, Vrefp, Vcm, and Vrefm each are exclusively selected by a corresponding one of the switches SDT, SDM, and SDB.

The other end of the first DAC capacitor Cd1, which is opposite to the one end connected to a reference voltage side, is made connectable with the AGND through the switch SD12, while being connected to an intermediate point of the inverted input terminal of the first operational amplifier OP1 and the first integral capacitor Cf1 through the switch SD13. In other words, the first DAC 31 is connected to the first integrator 11 through the switch SD13, and the other end of the first DAC capacitor Cd1 is connectable with the AGND through the switch SD12. The switch SD13 in the present embodiment corresponds to the first control switch.

The first sampling capacitor Cs1 is inserted between the input terminal of the analog signal Vin and the first integrator 11. Specifically, one end of the first sampling capacitor Cs1 is connected to the input terminal of the analog signal Vin through the switch SS11, and the other end of the first sampling capacitor Cs1 is connected to an intermediate point of an inverted input terminal of the first operational amplifier OP1 and the first integral capacitor Cf1 through the switch SS13. In other words, when the switch SS13 is turned on, the other end on a first operational amplifier OP1 side of the first sampling capacitor Cs1 is connected to the first integral capacitor Cf1, electrically. Further, an intermediate point of the first sampling capacitor Cs1 and the switch SS11 is connectable with the AGND through the switch SS14. On the other hand, an intermediate point of the first sampling capacitor Cs1 and the switch SS13 is made connectable with the AGND through the switch SS12.

The second modulation circuit 122 includes the same components and connection as in the first modulation circuit 121. In other words, as shown in FIG. 10, the second modulation circuit 122 includes a second integrator 12, a second D/A converter 32 (hereinafter, referred to as a second DAC 32), and a second sampling capacitor Cs2. The second integrator 12, the second DAC 32, and the second sampling capacitor Cs2 correspond to the first integrator 11, the first DAC 31, and the first sampling capacitor Cs1 in the first modulation circuit 121, respectively. A connection therebetween is also the same as the connection in the first modulation circuit 121.

Namely, in the configuration of the first the modulation circuit 121 described above, the first integrator 11, the first DAC 31, and the first sampling capacitor Cs1 may be replaced with the second integrator 12, the second DAC 32, and the second sampling capacitor Cs2, respectively. The second integrator 12 has a second operational amplifier OP2 and a second integral capacitor Cf2, and the second DAC 32 has a second DAC capacitor Cd2. As for each switch, switches corresponding to the switches SS11, SS12, SS13, and SS14 are referred to as switches SS21, SS22, SS23, and SS24, respectively. Switches corresponding to the switches SD12 and SD13 are referred to as switches SD22 and SD23, respectively. Switches corresponding to the switches SD1T, SD1M, and SD1B are referred to as switches SD2T, SD2M, and SD2B, respectively.

An output terminal of the second operational amplifier OP2 in the second modulation circuit 122 corresponds to a second output terminal, and an inverted input terminal of the second operational amplifier OP2 corresponds to a third input terminal. Further, the switch SD23 corresponds to a third control switch, and the switch SS23 corresponds to a fourth control switch.

An output voltage Vout1 of the first operational amplifier OP1 in first modulation circuit 121 is input to the second sampling capacitor Cs2 through the switch SS21. On the other hand, an output voltage Vout2 of the second operational amplifier OP2 in the second modulation circuit 122 is inputted to the quantizer 20. Feedback of a quantization result Qout is performed using both the first DAC 31 and the second DAC 32.

Figure 11:
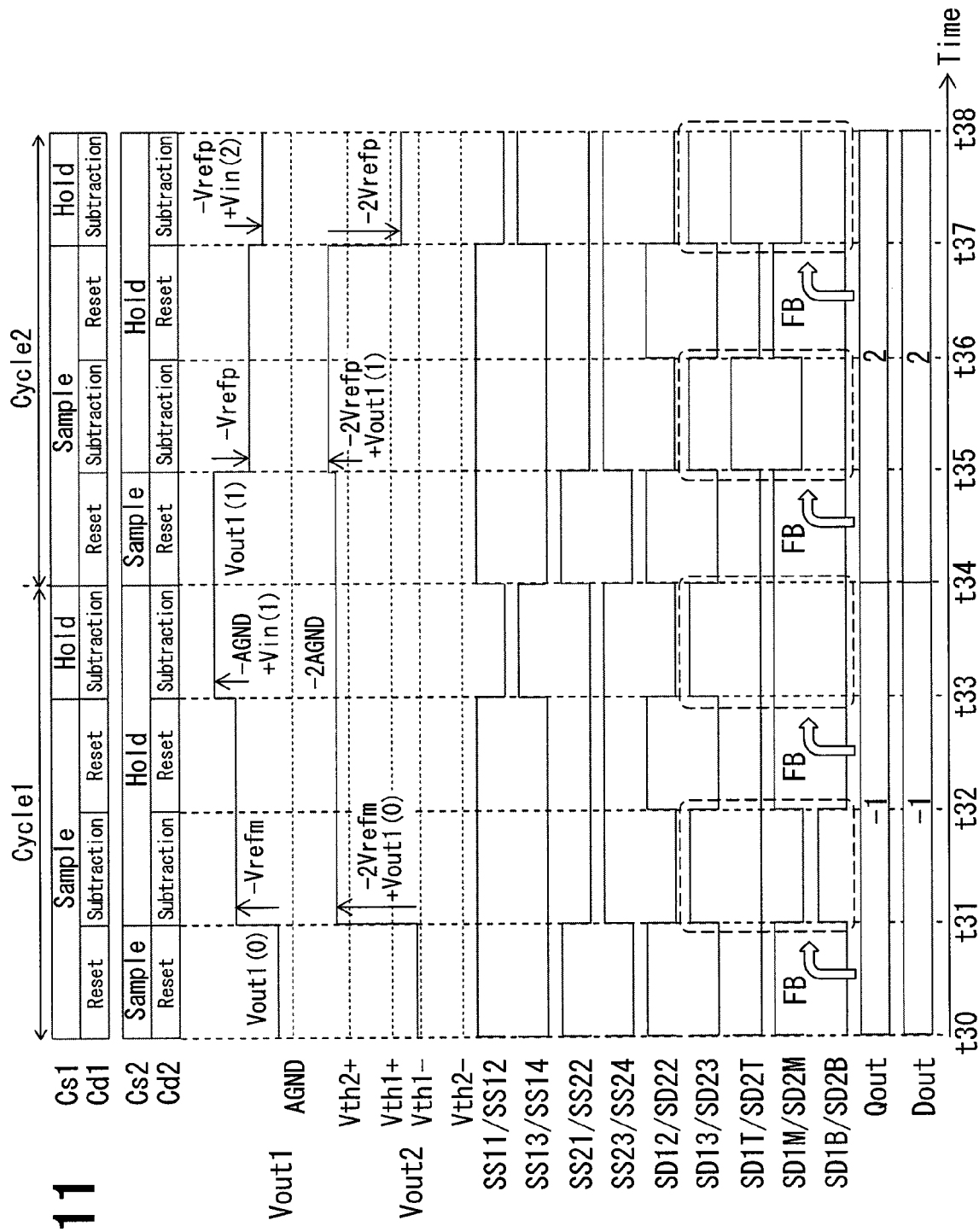
FIG. 11 is a timing chart showing an operation of the ΔΣ modulator in accordance with the third embodiment.

Next, an operation of the ΔΣ modulator 120 will be described with reference to FIG. 11. An operation between time t30 and time t38 corresponds to the operation between time t10 and time t18 in the first embodiment.

The first DAC 31 of the first modulation circuit 121 and the second DAC 32 of the second modulation circuit 122 are operated in synchronization with each other.

Specifically, as for the switches SD12 and SD22, the switch SD12 operates in the same manner as the switch SD22. Similarly, as for other switches, i.e., the switches SD13 and SD23, the switches SD1T and SD2T, the switches SD1M and SD2M, and the switches SD1B and SD2B, one switch operates in the same manner as the other switch. On the other hand, as for switches associated with sampling, the switches in the first modulation circuit 121 operate in different manners from the switches in the second modulation circuit 122.

At time t30, the switch SS11 and the switch SS12 are turned on, and the switch SS13 and the switch SS14 are turned off. By doing so, sampling is performed in the state where the first sampling capacitor Cs1 is disconnected from the first integrator 11, electrically.

At this time, in the second modulation circuit 122, the switch SS23 and the switch SS24 are turned off, and the switch SS21 and the switch SS22 are turned on. Thus, the second sampling capacitor Cs2 is disconnected from the second integrator 12, electrically. When the switch SS21 is turned on, the second sampling capacitor Cs2 and the output terminal of first operational amplifier OP1 are connected. In other words, electric charges corresponding to an output voltage Vout1 are stored in the second sampling capacitor Cs2. Herein, the output voltage Vout1 is outputted from the first operational amplifier OP1, in response to the analog signal Vin that has been sampled before time t30.

At time t30, an output voltage Vout2 of the second operational amplifier OP2 obtained at time t30 is quantized by the quantizer 20. The quantizer 20 in the present embodiment employs a quantizer having a resolution of 2 bits or more, like the fourth modification, and performs the quantization once per one sampling cycle. At time t30, since Vout2 satisfies Vth2−≤Vout2<Vth1−, the quantizer 20 outputs −1 as the quantization result Qout.

At time t31, sampling of the analog signal Vin by using the first sampling capacitor Cs1 is continued, and subsequent stage of the sampling of the output voltage Vout1 of the first operational amplifier OP1 by using the second sampling capacitor Cs2 in the second modulation circuit 122 is completed. Thus, electric charges are stored in the second sampling capacitor Cs2. In other words, the switches SS21 and SS22 are turned on, and the switch SS23 and the switch SS24 are turned off. Assumed that the output voltage Vout1 of the first operational amplifier between time t30 and time t31 is Vout1 (0) shown in FIG. 11, the electric charges based on Vout1 (0) are stored in the second sampling capacitor Cs2 between time t30 and time t31, and the electric charges are transmitted to the second integral capacitor Cf2 after time t31.

Between time t31 and time t32, and between time t33 and time t34, the feedback is performed based on the quantization result Qout by using the first DAC 31 and the second DAC 32, like the first embodiment and the second embodiment. Subtraction is performed from each of the electric charges stored in the first integral capacitor Cf1 and the second integral capacitor Cf2. For simplicity, a change in an amount of Vout1 and Vout2 at each time is also omitted in FIG. 11 like other timing charts, because the change is the same as in an amplification rate of a typical switched capacitor circuit, although being determined by a ratio of capacitances constituting the ΔΣ modulator 120. Further, as for a change in an amount of Vout2 caused by the feedback using the second DAC 32 in FIG. 11, a weighting factor of 2 is employed to describe the change as −2Vrefm, −2AGND, and −2Vrefp. Herein, the weighting factor of 2 is applied to the feedback using a DAC corresponding to the second DAC 32, when each integrator is assumed to have an amplification rate of 1 in a second-order ΔΣ modulator of a typical feedback type.

At time t33, a second subtraction is started. Further, the electric charges stored in the first sampling capacitor Cs1 are transmitted to the first integral capacitor Cf1. In the present embodiment, feedback is also performed twice between time t30 and time t34, i.e., during one sampling cycle.

After that, also in a sampling cycle between time t34 and time t38, each switch operates in the same manner as in the sampling cycle between time t30 and time t34. The sampling period between time t34 and time t38 corresponds to a second sampling period.

The present embodiment describes the ΔΣ modulator 120 including the first sampling capacitor Cs1 and the second sampling capacitor Cs2. The first sampling capacitor Cs1 has a sampling period of three times as long as the unit time. Even if a driving circuit for driving the first sampling capacitor Cs1 is operated at low speed, feedback of ΔΣ modulation can be performed at high speed. Further, the present embodiment describes an example in which the second sampling capacitor Cs2 has a sampling period of the unit time. The second sampling capacitor Cs2 is used to perform sampling of the output voltage Vout1 of the first operational amplifier OP1. If the first operational amplifier OP1 is configured by, for example, a fully differential amplifier and allowed to operate at high speed, the sampling through the second sampling capacitor Cs2 will not restrict operating speed of the ΔΣ modulator 120. As a result, the feedback of ΔΣ modulation may be performed at high speed.

The present embodiment describes the case where the ΔΣ modulator 120 is a second-order ΔΣ modulator, but not limited to this. A third- or higher-order ΔΣ modulator may be employed to set a sampling period of the sampling capacitor, corresponding to the first sampling capacitor Cs, to be longer than the unit time.

Other Embodiments

As mentioned above, the present disclosure has disclosed each of the embodiments, but not limited to the above-mentioned embodiments. Various changes and modification may be made and performed without departing from the scope of the present disclosure.

To simplify the description of operation, the above-mentioned embodiments and modifications each exemplarily show that the sampling period is twice or three times the unit time, but do not intend to limit the sampling period three times the unit time or less. The sampling period may be set more than three times the unit time. Similarly, the embodiments and the modifications each exemplarily show that the hold period is equal to or twice the unit time, but not limited to this. The hold period may be set to more than twice the unit time.

The second modification describes the configuration in which a phase of the sampling period is delayed or advanced by one unit time with respect to the first embodiment, but not limited to this. For a phase of the sampling period, delay and advance may be changed in a range exceeding one unit time, as necessary. Similarly, in each of the embodiments and the modifications other than the first embodiment and the second modification, a phase of the sampling period may be changed, as necessary.

The above-mentioned embodiments and modifications each show that feedback of the quantization result Qout is performed once for every two unit times, although the feedback is performed a plurality of times per one sampling cycle, but not limited to this. The feedback may be performed once during three unit times or more, or may be performed once during one unit time. Further, it is not necessary to perform feedback of the quantization result Qout at equal intervals. Feedback timing may be determined depending on an operating state of the sampling capacitor, an operating state of a circuit in the previous stage for driving the sampling capacitor, desired resolution, or the like.

The above-mentioned embodiments and modifications each describe the method in which feedback of the quantization result Qout is performed such that the DAC voltage is determined after the DAC capacitor Cd is reset, and electric charges are transmitted to the integral capacitor, but not limited to this. Another method may be used for transmitting the electric charges to the integral capacitor from the DAC capacitor Cd. For instance, the following method may be chosen, i.e., the DAC voltage is set to the AGND after the DAC voltage is determined in advance, and electric charges are transmitted to the integral capacitor. Further, another method may be chosen, i.e., the first DAC voltage is determined in advance, and then the second DAC voltage is determined to transmit electric charges.

To simplify the description of operation, the above-mentioned embodiments and modifications each exemplarily show that a predetermined analog signal Vin is input as the quantization result Qout. The quantization result Qout, however, depends on the analog signal Vin to be inputted, or the number of operating bits of quantizer 20. Therefore, the quantization result Qout is not necessarily the same as that of the above-mentioned example. Accordingly, reference voltages (DAC voltage) of DAC 30, DAC 31, and DAC 32, which are determined in feedback of the quantization result Qout, depend on the analog signal Vin. Thus, Vrefp, Vm, and Vrefm are exclusively selected. In other words, the reference voltages are selected based on the quantization result Qout, as necessary.

The above-mentioned embodiments and modifications each describe the quantizer 20 having a resolution of 1.5 bits or 2.5 bits, but not limited to this. A quantizer having a resolution of 1 bit or 2 bits or more may be employed.

The above-mentioned embodiments and modifications each show that quantization is performed once or twice per one sampling cycle, but not limited to this. The number of times of quantization may be determined, as necessary, depending on resolution of quantizer 20, resolution of the DAC, the number of times of the feedback of the quantization result Qout per one sampling cycle, or the like. Further, the quantization result Qout may be obtained before the corresponding quantization result Qout is feedbacked. Therefore, quantization timing may be determined, as necessary, depending on an operating state of the DAC or an operating state of the sampling capacitor.

The above-mentioned embodiments and modifications each describe a first- or second-order $\Delta\Sigma$ modulator of a feedback type, but not limited to this. A higher-order modulator, or $\Delta\Sigma$ modulators of a feedforward type, a cascade type, or the like may be employed.

It is possible to configure an A/D converter such that, using the $\Delta\Sigma$ modulator described in each of the above-mentioned embodiments and modifications, a $\Delta\Sigma$ modulation result (typically, also called a bit stream), which serves as an output of the $\Delta\Sigma$ modulator, is processed through a digital filter disposed in a subsequent stage of the $\Delta\Sigma$ modulator, like a typical $\Delta\Sigma$ modulator. Further, in a subsequent stage of the $\Delta\Sigma$ modulator, an integrator may be disposed, instead of the digital filter. Herein, the integrator is configured by a digital circuit having the number of stages corresponding to the order of the $\Delta\Sigma$ modulator. Thus, an integrator of the $\Delta\Sigma$ modulator, and the integrator configured by the digital circuit are operated during a predetermined period after being reset once, thereby being operated as an A/D converter, i.e., the $\Delta\Sigma$ modulator may be used as so-called an incremental $\Delta\Sigma$ A/D modulator.

To simplify the description of operation, the above-mentioned embodiments and modifications each are described using a single-ended circuit configuration, but a differential circuit configuration may also be employed.

What is claimed is:

1. A $\Delta\Sigma$ modulator comprising:
an integrator that has an operational amplifier and an integral capacitor, the operational amplifier having a first input terminal and an output terminal, the integral capacitor inserted between the first input terminal and the output terminal;
a quantizer that is configured to output a quantization result obtained by quantizing an output signal of the operational amplifier;
a D/A converter that is connected to the first input terminal through a first control switch, and that is configured to subtract an electric charge based on the quantization result from an electric charge stored in the integral capacitor to perform feedback of the quantization result to the integrator in $\Delta\Sigma$ modulation;
a control circuit that is configured to output a digital output value based on the quantization result; and
a sampling capacitor that is connected to the first input terminal through a second control switch, and that is configured to store an electric charge based on an analog signal as an input signal, wherein the second control switch is disposed between the sampling capacitor and an intermediate point of the integral capacitor and the first input terminal, and is configured to switch on and off an electrical connection between the sampling capacitor and the intermediate point, wherein a plurality of feedbacks of the quantization results are performed in the ΔΣ modulation on the analog signal per one sampling cycle, which includes (i) a sampling period during which the second control switch is turned off and (ii) a sampling period during which the second control switch is turned on, and wherein the first control switch is configured to be turned on and turned off a plurality of times corresponding to the plurality of feedbacks of the quantization results.

2. The ΔΣ modulator according to claim 1,
wherein the quantizer has a resolution of 1 bit or 1.5 bits,
wherein the quantizer performs a predetermined total number of times of quantization, and
wherein the feedback of the quantization result is performed with the predetermined total of times during one sampling cycle.

3. The ΔΣ modulator according to claim 1,
wherein the digital output value corresponding to each sampling cycle is determined based on a plurality of quantization results to be output per one sampling cycle.

4. The ΔΣ modulator according to claim 1,
wherein the quantizer has a resolution of 2 bits or more; and
wherein quantization by the quantizer is performed only once per one sampling cycle by feedbacking the quantization result sequentially through the D/A converter.

5. The ΔΣ modulator according to claim 1,
wherein the sampling period is set three times as long as a half period associated with the feedback of the quantization result by the quantizer.

6. The ΔΣ modulator according to claim 1,
wherein the sampling period is set twice as long as a half period associated with the feedback of the quantization result by the quantizer.

7. The ΔΣ modulator according to claim 1,
wherein an output terminal of the operational amplifier is connected to the quantizer through a second modulation circuit,
wherein the second modulation circuit includes:
a second integrator that has a second operational amplifier and a second integral capacitor, the second operational amplifier having a third input terminal and a second output terminal, the second integral capacitor inserted between the third input terminal and the second output terminal;
a second D/A converter that is connected to the third input terminal through a third control switch, and that is configured to determine a DAC voltage to subtract an electric charge stored in the second integral capacitor through a feedback of the quantization result; and
a second sampling capacitor that is connected to the third input terminal through a fourth control switch, and that is configured to store an electric charge based on the output signal of the operational amplifier,
wherein the fourth control switch is disposed between the second sampling capacitor and an intermediate point of the second integral capacitor and the third input terminal, and is configured to switch on and off an electrical connection between the second sampling capacitor and the intermediate point,
wherein the plurality of feedbacks of the quantization result are performed per one sampling cycle, which includes (i) a first sampling period during which the second control switch is turned off and (ii) a period during which the second control switch is turned on,
wherein the plurality of feedbacks of the quantization result are performed per one sampling cycle, which includes (i) a second sampling period during which the fourth control switch is turned off and (ii) a period during which the fourth control switch is turned on, and
wherein second- or higher-order ΔΣ modulation is performed with respect to the analog signal to be input.

8. The ΔΣ modulator according to claim 7,
wherein the first control switch and the third control switch are driven in synchronization with each other.

9. The ΔΣ modulator according to claim 7,
wherein respective phases or respective lengths of the first sampling period and the second sampling period are different from each other.

10. A ΔΣ A/D converter comprising the ΔΣ modulator according to claim 1.

11. An incremental ΔΣ A/D converter comprising the ΔΣ modulator according to claim 1.

12. The ΔΣ modulator according to claim 1,
wherein the quantizer has a resolution of 2 bits or more; and
wherein quantization by the quantizer is performed at least once per one sampling cycle by feedbacking the quantization result sequentially through the D/A converter.

13. The ΔΣ modulator according to claim 1, further comprising:
a second modulation circuit that includes
a second integrator that has a second operational amplifier and a second integral capacitor, the second operational amplifier having a third input terminal and a second output terminal, the second integral capacitor inserted between the third input terminal and the second output terminal,
a second D/A converter that is connected to the third input terminal through a third control switch, and that is configured to determine a DAC voltage to subtract an electric charge stored in the second integral capacitor through a feedback of the quantization result, and
a second sampling capacitor that is connected to the third input terminal through a fourth control switch, and that is configured to store an electric charge based on the output signal of the operational amplifier,
wherein the operational amplifier further includes an output terminal, and
wherein the output terminal is connected to the quantizer through the second modulation circuit.

14. The ΔΣ modulator according to claim 13,
wherein the fourth control switch is disposed between the second sampling capacitor and an intermediate point of the second integral capacitor and the third input terminal, and is configured to switch on and off an electrical connection between the second sampling capacitor and the intermediate point,
wherein the plurality of feedbacks of the quantization result are performed per one sampling cycle, which includes (i) a first sampling period during which the second control switch is turned off and (ii) a period during which the second control switch is turned on, wherein the plurality of feedbacks of the quantization result are performed per one sampling cycle, which includes (i) a second sampling period during which the fourth control switch is turned off and (ii) a period during which the fourth control switch is turned on, and wherein second- or higher-order $\Delta\Sigma$ modulation is performed with respect to the analog signal to be input.

15. The $\Delta\Sigma$ modulator according to claim 1, wherein the first control switch and the second control switch are provided separately.

* * * * *